(12) United States Patent
Anderson et al.

(10) Patent No.: US 11,289,371 B2
(45) Date of Patent: Mar. 29, 2022

(54) TOP VIAS WITH SELECTIVELY RETAINED ETCH STOPS

(71) Applicant: INTERNATIONAL BUSINESS MACHINES CORPORATION, Armonk, NY (US)

(72) Inventors: Brent Anderson, Jericho, VT (US); Lawrence A. Clevenger, Saratoga Springs, NY (US); Christopher J. Penny, Saratoga Springs, NY (US); Nicholas Anthony Lanzillo, Wynantskill, NY (US); Kisik Choi, Watervliet, NY (US); Robert Robison, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 63 days.

(21) Appl. No.: 16/750,040

(22) Filed: Jan. 23, 2020

(65) Prior Publication Data
US 2021/0233807 A1   Jul. 29, 2021

(51) Int. Cl.
| | |
|---|---|
| *H01L 21/768* | (2006.01) |
| *H01L 21/311* | (2006.01) |
| *H01L 21/02* | (2006.01) |
| *H01L 21/033* | (2006.01) |

(52) U.S. Cl.
CPC .. *H01L 21/76832* (2013.01); *H01L 21/02126* (2013.01); *H01L 21/0337* (2013.01); *H01L 21/31144* (2013.01); *H01L 21/76816* (2013.01); *H01L 21/76897* (2013.01)

(58) Field of Classification Search
CPC ......... H01L 21/76832; H01L 21/02126; H01L 21/0337; H01L 21/31144; H01L 21/76816; H01L 21/76897
See application file for complete search history.

(56) References Cited

U.S. PATENT DOCUMENTS

| | | |
|---|---|---|
| 5,693,568 A | 12/1997 | Liu et al. |
| 6,743,669 B1 | 6/2004 | Lin et al. |
| 6,924,222 B2 | 8/2005 | Goodner et al. |
| 7,071,532 B2 | 7/2006 | Geffken et al. |
| 8,202,803 B2 | 6/2012 | Feurprier et al. |
| 9,437,483 B2 | 9/2016 | Lee et al. |
| 9,613,861 B2 | 4/2017 | Anderson et al. |
| 9,659,864 B2 | 5/2017 | Wu et al. |
| 9,922,972 B1 | 3/2018 | Qiu et al. |
| 10,032,643 B2 | 7/2018 | Chawla et al. |
| 2008/0173981 A1* | 7/2008 | Chinthakindi .......... H01L 28/91 257/535 |
| 2018/0315654 A1* | 11/2018 | Briggs .............. H01L 23/53228 |
| 2019/0115441 A1* | 4/2019 | Tan ........................ H01L 29/408 |
| 2019/0148545 A1 | 5/2019 | Bu et al. |

\* cited by examiner

*Primary Examiner* — Telly D Green
*Assistant Examiner* — Andre C Stevenson
(74) *Attorney, Agent, or Firm* — Tutunjian & Bitetto PC; Randall Bluestone

(57) ABSTRACT

Integrated chips and methods of forming the same include forming conductive lines on an underlying layer, between regions of dielectric material. The regions of dielectric material are selectively patterned, leaving at least one dielectric remnant region. An interlayer dielectric is formed over the underlying layer and the at least one dielectric remnant region, between the conductive lines.

20 Claims, 7 Drawing Sheets

TOP VIAS WITH SELECTIVELY RETAINED ETCH STOPS

BACKGROUND

The present invention generally relates to integrated chip fabrication, and, more particularly, to the fabrication of multi-layer chips with an etch stop layer retained in some places.

During fabrication of multi-layer integrated circuits, etch stop layers can be used to prevent an etch from reaching beyond the layer it was intended for. The etch stop layer is often removed, to improve capacitance properties of the circuit.

SUMMARY

A method of forming an integrated chip includes forming conductive lines on an underlying layer, between regions of dielectric material. The regions of dielectric material are selectively patterned, leaving at least one dielectric remnant region. An interlayer dielectric is formed over the underlying layer and the at least one dielectric remnant region, between the conductive lines.

A method of forming an integrated chip includes selectively patterning a dielectric material, to leave at least one dielectric remnant region on an underlying layer. Conductive lines are formed on the underlying layer, with at least one conductive line being formed on a respective dielectric remnant region. An interlayer dielectric is formed over the underlying layer, between the conductive lines.

An integrated chip includes a first dielectric remnant, formed from a first dielectric material on an underlying layer. Conductive lines are on the underlying layer. An interlayer dielectric is on the underlying layer, formed from a second dielectric material between the conductive lines.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention form a multi-layer integrated chip. An etch stop layer is used when structures are formed in an upper layer, to prevent etches from damaging an underlying lower layer. Rather than removing all of the etch stop layer after the structures have been formed, the present embodiments mask certain regions before the etch stop layer is etched. In this manner, remnants of the etch stop layer can be preserved in regions where they are useful.

For example, in some regions, leaving the etch stop layer in place helps improve dielectric breakdown behavior, preventing high voltages from causing damage to the chip. In other regions, the etch stop layer can still be removed to reduce parasitic capacitance and delay. In some embodiments, the etch stop remnants can be used between neighboring lines to prevent line-to-line dielectric breakdown, or underneath lines to prevent line-to-via dielectric breakdown.

Figure 1:
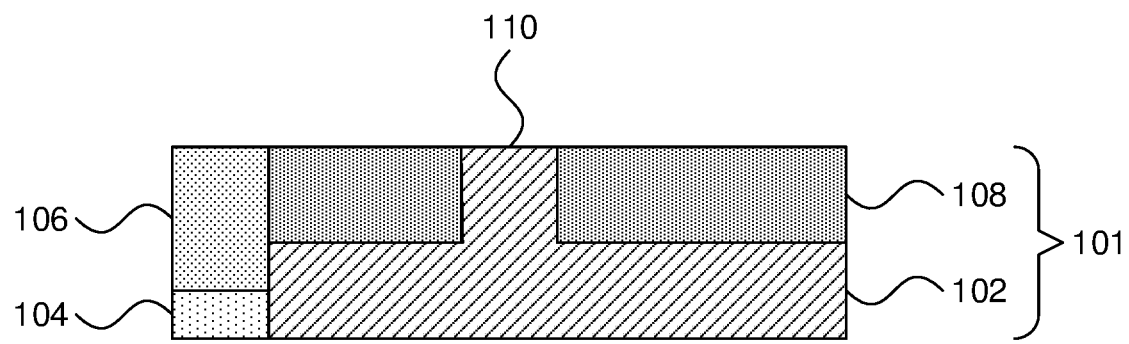
FIG. 1 is a cross-sectional view of a step in the formation of a multi-layer integrated chip with selectively preserved etch stop remnants that shows the formation of a first chip layer in accordance with an embodiment of the present invention.

Referring now to the drawings in which like numerals represent the same or similar elements and initially to FIG. 1, a cross-sectional view of a step in the fabrication of a multi-layer integrated chip is shown. A first chip layer 101 of the integrated chip is shown. The first chip layer 101 may not be the lowest layer, and may have additional underlying layers, or a substrate, formed beneath the first chip layer 101. These layers are not shown herein, but may include any variety of structures, electrical vias, and/or passive or active electronic components.

A conductive line 102 is shown. The conductive line 102 can be formed from any appropriate conductive material, for example a metal, such as tungsten, nickel, titanium, molybdenum, tantalum, copper, platinum, silver, gold, ruthenium, iridium, rhenium, rhodium, and alloys thereof. The conductive line 102 can alternatively be formed from a doped semiconductor material such as, e.g., doped polysilicon. A conductive via 110 can be formed in electrical contact with the conductive line 102, and can be formed from any appropriate conductive material. The conductive via 110 can, in particular, be formed from the same material as the conductive line 102, or can alternatively be formed from a different material.

At one or more ends of the conductive line 102, a dielectric cut structure can be formed. The dielectric cut structure can include an interlayer dielectric material 106 and an etch stop layer remnant 104. It is contemplated that the interlayer dielectric material 106 can be formed from any appropriate dielectric material, such as silicon dioxide or silicon nitride, and that the etch stop layer 104 can be formed from a dielectric material that is selectively etchable with respect to the interlayer dielectric material 106. As used herein, the term "selective," in reference to a material removal process, denotes that the rate of material removal for a first material is greater than the rate of removal for at least another material of the structure to which the material removal process is being applied.

In some embodiments, the etch stop layer 104 can be formed from a high-k dielectric material, for example including metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum. As used herein, the term "high-k" refers to materials that have a dielectric constant that is higher than that of silicon dioxide.

An interlayer dielectric 108 is formed over the conductive line 102 and around the via 110. The interlayer dielectric 108 can be formed from any appropriate material, such as silicon dioxide, and can be deposited to a height above the via 110, then polished down to expose the via 110 using, e.g., a chemical mechanical planarization (CMP) process.

Figure 2:
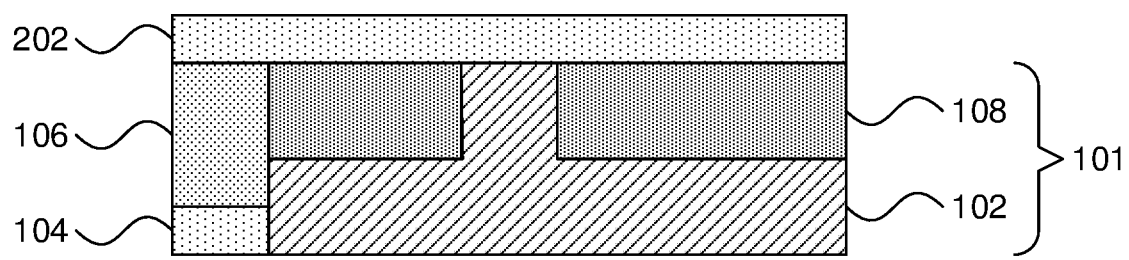
FIG. 2 is a cross-sectional view of a step in the formation of a multi-layer integrated chip with selectively preserved etch stop remnants that shows the formation of an etch stop layer on the first chip layer in accordance with an embodiment of the present invention.

Referring now to FIG. 2, a cross-sectional view of a step in the fabrication of a multi-layer integrated chip is shown. An etch stop layer 202 is deposited over the first chip layer 101. The etch stop layer 202 can be formed from any appropriate dielectric material having the requisite etch selectivities, and it is specifically contemplated that a high-k dielectric material can be used. Exemplary materials for the etch stop layer can include, but are not limited to, aluminum nitride, aluminum oxide, and hafnium dioxide. Any appropriate deposition process can be used, such as chemical vapor deposition (CVD), physical vapor deposition (PVD), atomic layer deposition (ALD), or gas cluster ion beam (GCIB) deposition.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 3:
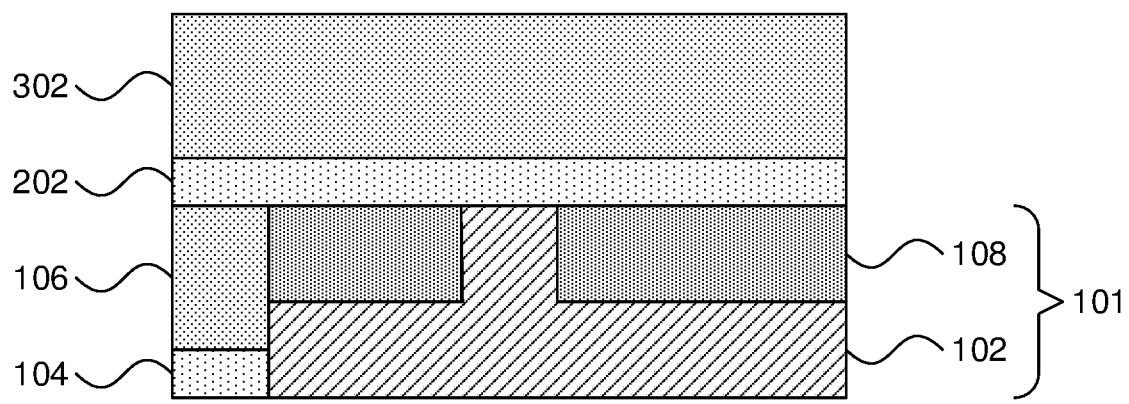
FIG. 3 is a cross-sectional view of a step in the formation of a multi-layer integrated chip with selectively preserved etch stop remnants that shows the formation of a layer of patterning material on the etch stop layer in accordance with an embodiment of the present invention.

Referring now to FIG. 3, a cross-sectional view of a step in the fabrication of a multi-layer integrated chip is shown. A layer of patterning material 302 is deposited over the etch stop layer 202. The layer of patterning material 302 can be formed from any appropriate material that has etch selectivity with the etch stop layer and can be formed using any appropriate deposition process, such as CVD, ALD, PVD, or GCIB deposition. Exemplary materials that can be used for the patterning material can include, but are not limited to, ultra-low-k silicon dioxide-based dielectrics, spin-on glass dielectrics, and flowable dielectrics. The thickness of the layer of patterning material 302, combined with the thickness of the etch stop layer 202, will define the height of lines being formed on this level of the chip.

Figure 4:
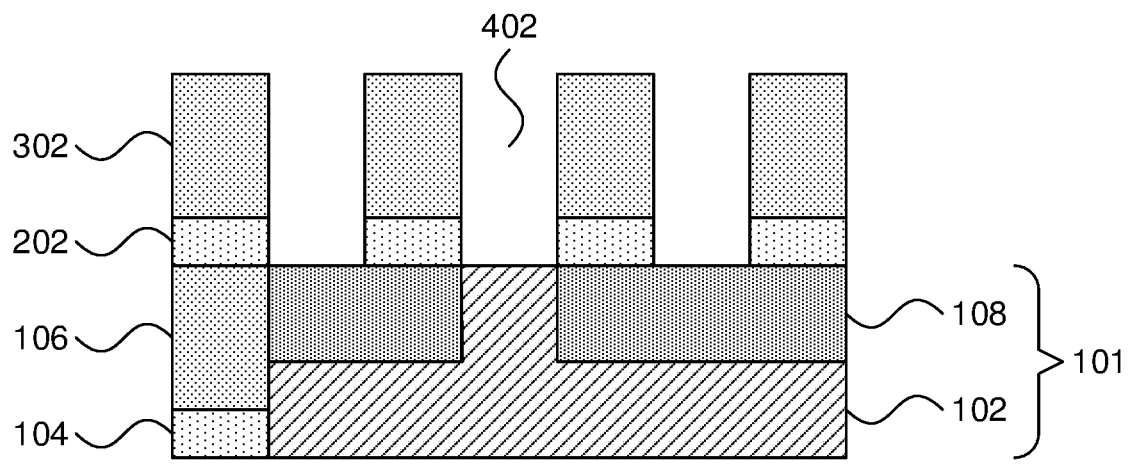
FIG. 4 is a cross-sectional view of a step in the formation of a multi-layer integrated chip with selectively preserved etch stop remnants that shows the patterning of the layer of patterning material and the etch stop layer to form trenches in accordance with an embodiment of the present invention.

Referring now to FIG. 4, a cross-sectional view of a step in the fabrication of a multi-layer integrated chip is shown. The layer of patterning material 302 and the etch stop layer 202 are patterned to form trenches 402. The pattern for the trenches 402 can be formed by any appropriate process, such as photolithographic etching. The trenches 402 can be formed by one or more selective, anisotropic etches, such as a reactive ion etch (RIE). The trenches 402 can expose the top surface of the via 110. The etch stop layer 202 prevents the etch of the layer of patterning material 302 from damaging underling structures, such as the interlayer dielectric material 106.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

It should be noted that FIG. 4 represents embodiments where the etch stop layer 202 is removed from all of the trenches 402. In other embodiments, portions of the etch stop layer 202 can be preserved at the bottom of one or more trenches 402 by masking the corresponding region(s) after etching the layer of patterning material 302 and before etching the etch stop layer 202. Such embodiments will be described in greater detail below.

Figure 5:
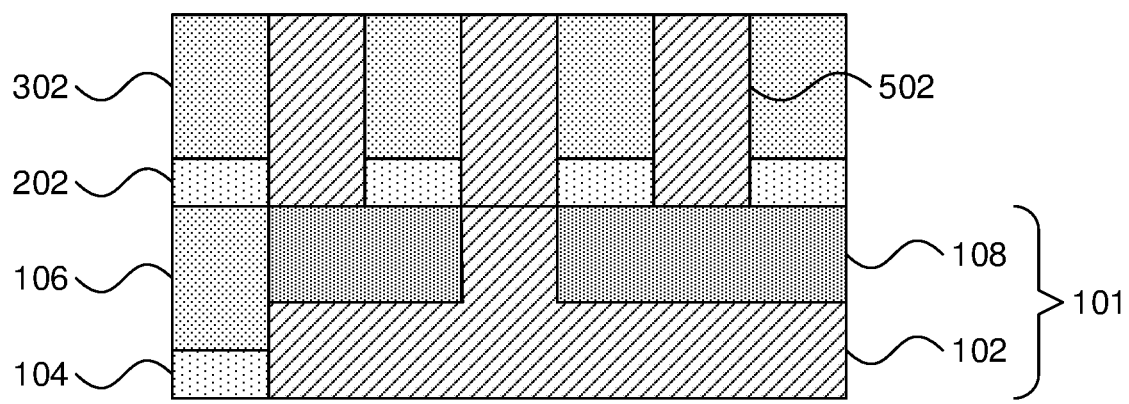
FIG. 5 is a cross-sectional view of a step in the formation of a multi-layer integrated chip with selectively preserved etch stop remnants that shows the formation conductive lines in the trenches in accordance with an embodiment of the present invention.

Referring now to FIG. 5, a cross-sectional view of a step in the fabrication of a multi-layer integrated chip is shown. Conductive lines 502 are deposited in the trenches by any appropriate deposition process, such as CVD, PVD, ALD, or GCIB deposition. Conductive material can be deposited to a height above the height of the layer of patterning material 302 and can then be polished down using a CMP process, separating the respective conductive lines 502 when the height of the conductive material reaches the top surface of the layer of patterning material 302. The conductive material of the conductive lines 502 can be the same as the lower conductive lines 102 or can be a different conductive material.

Figure 6:
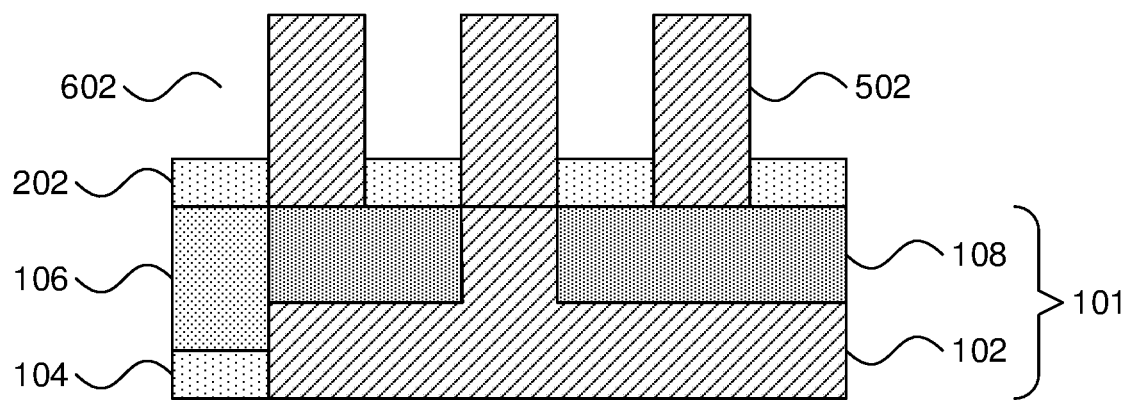
FIG. 6 is a cross-sectional view of a step in the formation of a multi-layer integrated chip with selectively preserved etch stop remnants that shows the removal of the layer of patterning material, thereby exposing remaining portions of the etch stop layer between the conductive lines, in accordance with an embodiment of the present invention.

Referring now to FIG. 6, a cross-sectional view of a step in the fabrication of a multi-layer integrated chip is shown. The remaining portions of the layer of patterning material 302 are etched away using any appropriate isotropic or anisotropic etch that selectively removes the patterning material, without damaging the etch stop layer 202 or the conductive lines 502. Openings 602 are formed between the conductive lines 502 and the top surfaces of the remaining portions of the etch stop layer 202 are exposed.

Figure 7:
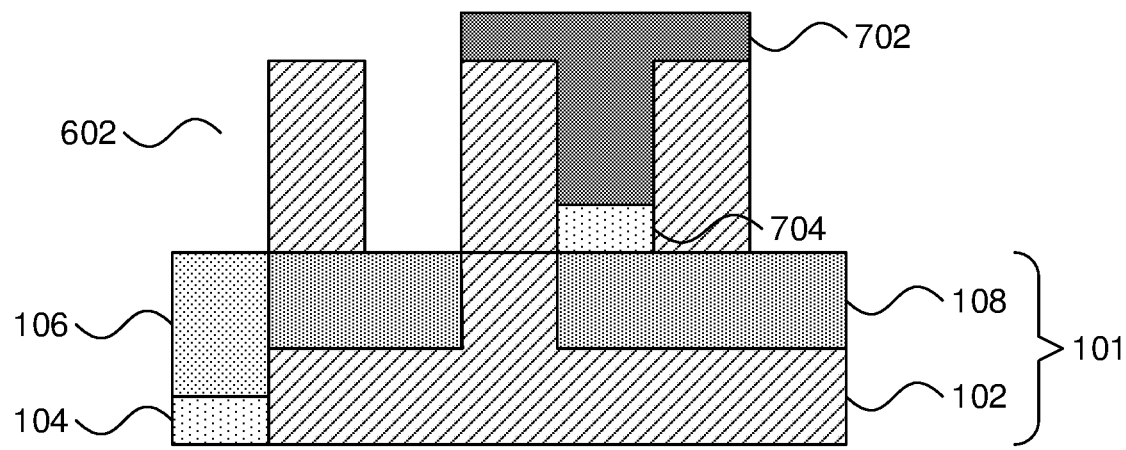
FIG. 7 is a cross-sectional view of a step in the formation of a multi-layer integrated chip with selectively preserved etch stop remnants that shows the formation of a mask over a remaining portion of the etch stop layer and the removal of any uncovered portions of the etch stop layer, to form an etch stop layer remnant, in accordance with an embodiment of the present invention.

Referring now to FIG. 7, a cross-sectional view of a step in the fabrication of a multi-layer integrated chip is shown. A mask 702 is formed over a region of the chip, covering one or more remaining portions 704 of the etch stop layer 202. Any portions of the etch stop layer 202 that are still exposed, outside of the masked region, are etched away using any appropriately selective isotropic or anisotropic etch.

Figure 8:
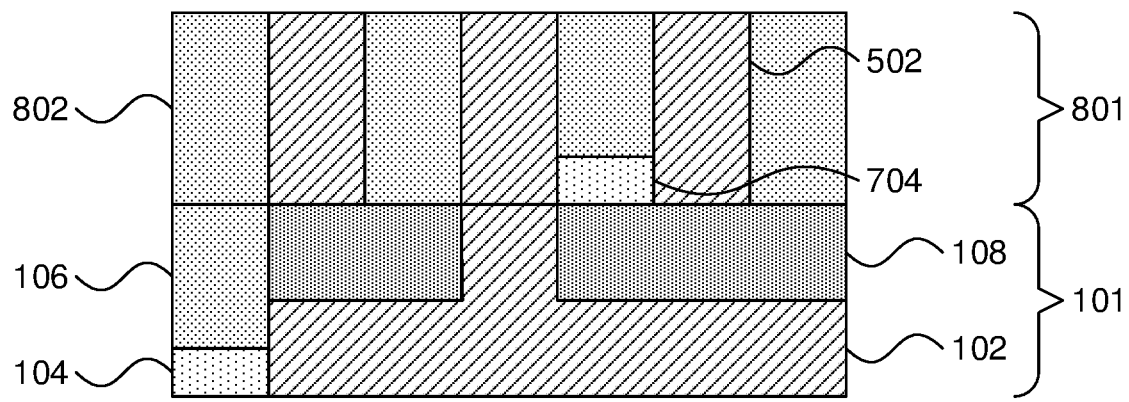
FIG. 8 is a cross-sectional view of a step in the formation of a multi-layer integrated chip with selectively preserved etch stop remnants that shows the formation of dielectric material between the conductive lines to form an upper chip layer in accordance with an embodiment of the present invention.

Referring now to FIG. 8, a cross-sectional view of a step in the fabrication of a multi-layer integrated chip is shown. The mask 702 is removed and an interlayer dielectric 802 is deposited by any appropriate deposition process, followed by a CMP process to expose the top surfaces of the conductive lines 502. The remaining etch stop layer portion(s) 704 provide an improved barrier against line-to-line dielectric breakdown for certain conductive lines 502, while the regions that have no etch stop layer benefit from reduced parasitic capacitance.

Figure 9:
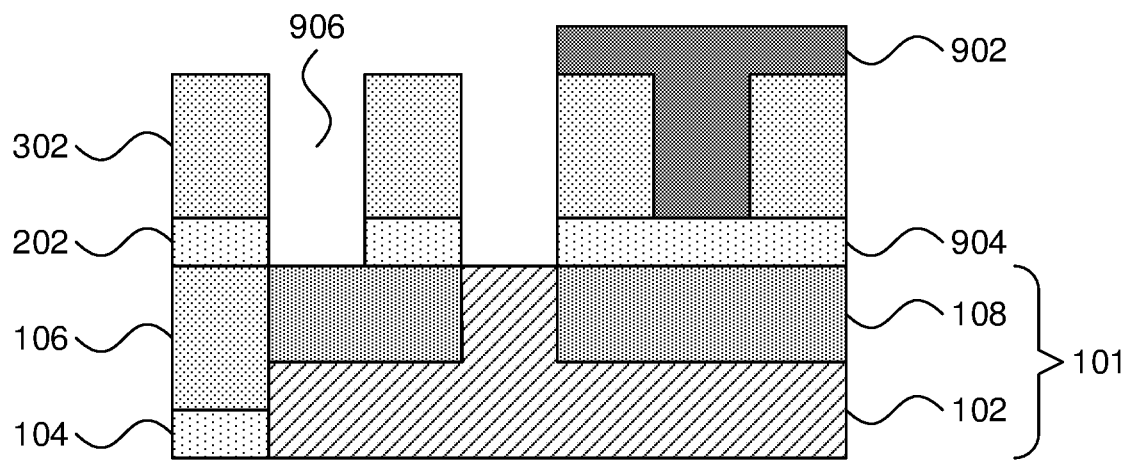
FIG. 9 is a cross-sectional view of a step in the formation of an alternative embodiment of a multi-layer integrated chip with selectively preserved etch stop remnants that shows the formation of a mask over a portion of the etch stop layer, in a trench of the layer of patterning material, before the etch stop layer is patterned, in accordance with an embodiment of the present invention.

Referring now to FIG. 9, a cross-sectional view of a step in an alternative embodiment of the fabrication of a multi-layer integrated chip is shown. This step continues from FIG. 3. The layer of patterning material 302 is patterned to form trenches 906. Rather than removing all portions of the etch stop layer 202 that are exposed in the trenches 906, this embodiment forms a mask 902 over one or more portions 904 of the etch stop layer 202. Thus, even after the anisotropic etch stop removal, the covered portion 904 of the etch stop layer 202 includes some etch stop material at the bottom of a respective trench 906.

Figure 10:
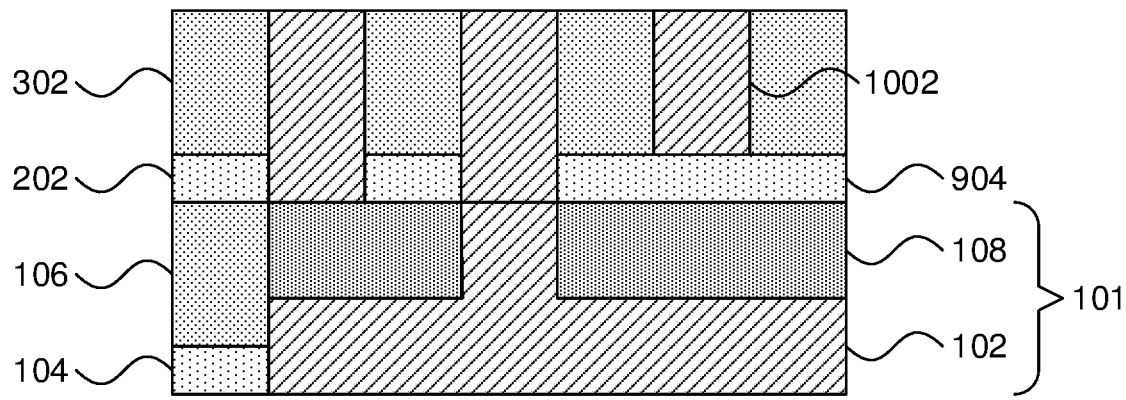
FIG. 10 is a cross-sectional view of a step in the formation of an alternative embodiment of a multi-layer integrated chip with selectively preserved etch stop remnants that shows the formation of conductive lines in the trenches, including at least one trench with an etch stop remnant at the bottom, in accordance with an embodiment of the present invention.

Referring now to FIG. 10, a cross-sectional view of a step in an alternative embodiment of the fabrication of a multi-layer integrated chip is shown. The mask 902 is removed and metal lines 1002 are formed in the trenches 906 by, e.g., depositing conductive material by any appropriate process and then polishing down to the top surface of the layer of patterning material 302.

Figure 11:
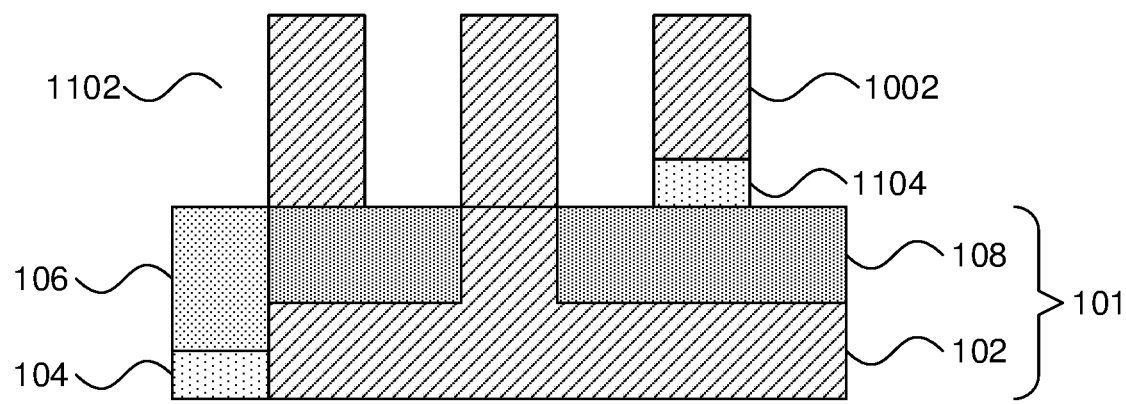
FIG. 11 is a cross-sectional view of a step in the formation of an alternative embodiment of a multi-layer integrated chip with selectively preserved etch stop remnants that shows the removal of the layer of patterning material in accordance with an embodiment of the present invention.

Referring now to FIG. 11, a cross-sectional view of a step in an alternative embodiment of the fabrication of a multi-layer integrated chip is shown. The remaining portions of the layer of patterning material 302 are etched away using any appropriately selective isotropic or anisotropic etch. Any exposed portions of the remaining etch stop layer 202 are then also anisotropically etched away, leaving only the portion(s) 1104 that are protected by the metal lines 1002. Openings 1102 are formed between the metal lines 1002.

Figure 12:
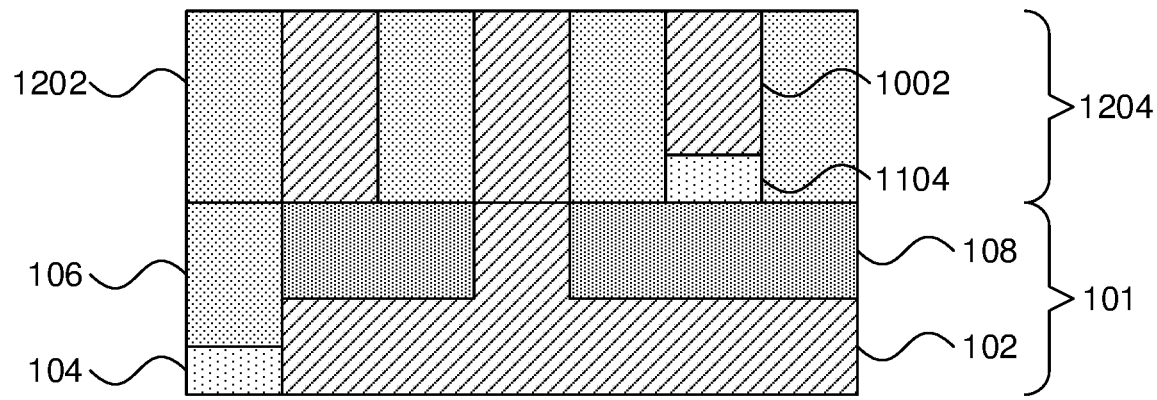
FIG. 12 is a cross-sectional view of a step in the formation of an alternative embodiment of a multi-layer integrated chip with selectively preserved etch stop remnants that shows the formation of dielectric material between the conductive lines to form an upper chip layer in accordance with an embodiment of the present invention.

Referring now to FIG. 12, a cross-sectional view of a step in an alternative embodiment of the fabrication of a multi-layer integrated chip is shown. An interlayer dielectric 1202 is deposited by any appropriate deposition process, followed by a CMP process to expose the top surfaces of the conductive lines 1002. This completes the upper layer 1204. The remaining etch stop layer portion(s) 1104 provide an improved barrier against via-to-line dielectric breakdown for certain conductive lines 1002, while the regions that have no etch stop layer benefit from reduced parasitic capacitance.

Figure 13:
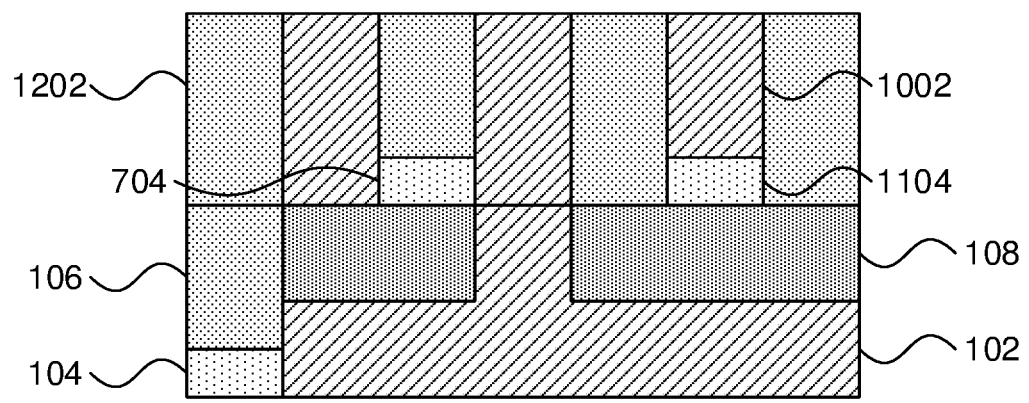
FIG. 13 is a cross-sectional view of a step in the formation of an alternative embodiment of a multi-layer integrated chip with selectively preserved etch stop remnants that shows the etch stop remnants in two different locations, including between conductive lines and between a conductive line and the lower layer, in accordance with an embodiment of the present invention.

Referring now to FIG. 13, a cross-sectional view of a step in an alternative embodiment of the fabrication of a multi-layer integrated chip is shown. In this embodiment, a first etch stop remnant 704 is positioned between adjacent conductive lines, and a second etch stop remnant 1104 is positioned between a conductive line and an underlying layer. Any number of etch stop remnants can be included in this fashion, in any appropriate location on the chip.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "an" "the" are intended to include the plural fogs as well, unless the context clearly indicates otherwise. It will be further understood that the terms "comprises," "comprising" "includes" and/or "including," when used herein, specify the presence of stated features, integers, steps, operations, elements and/or components, but do not preclude the presence or addition of one or more other features, integers, steps, operations, elements, components cl ups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms ended to encompass different orientations of the device in use or operation in addition A the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 14:
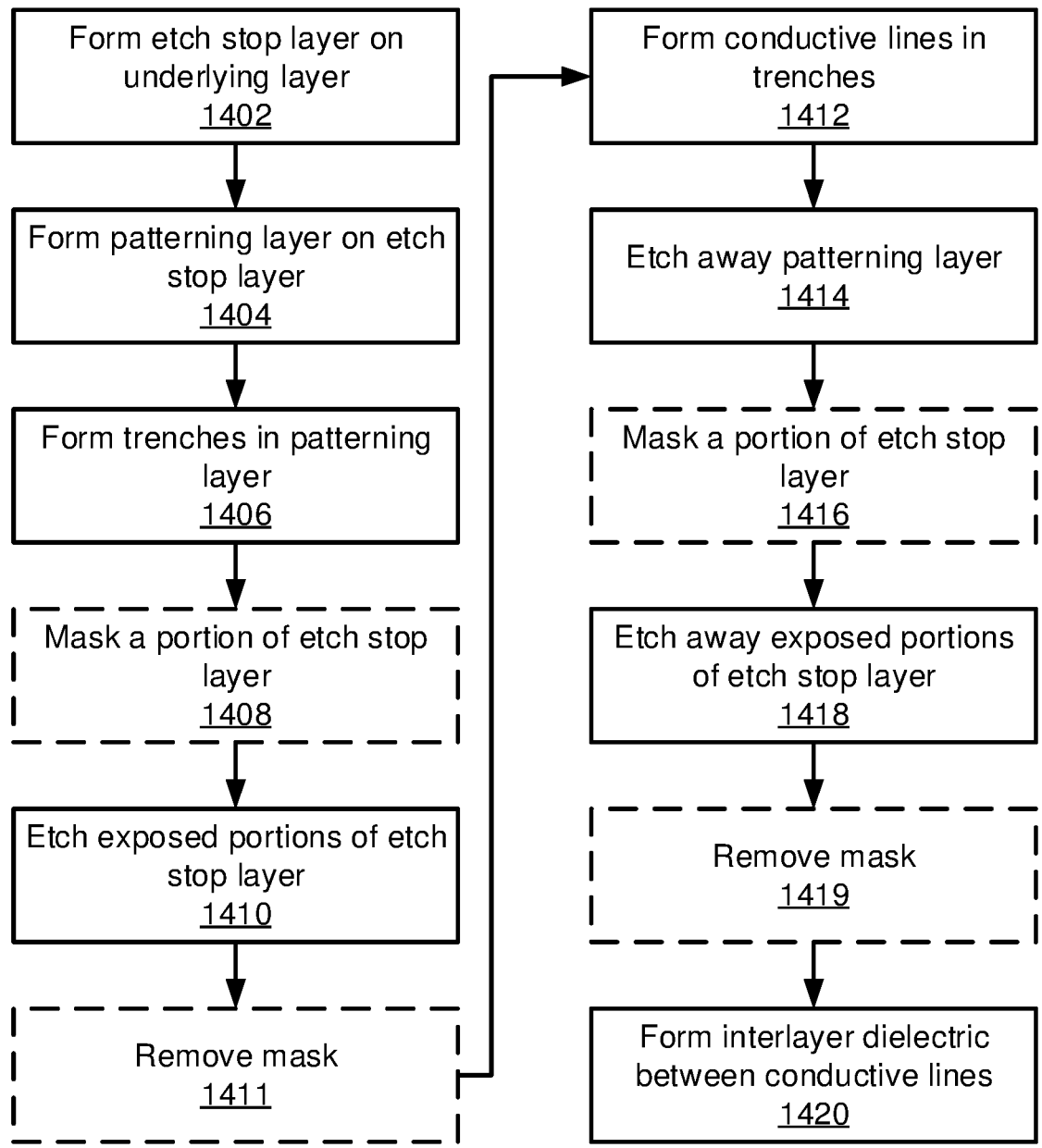
FIG. 14 is a block/flow diagram of a method of forming an integrated chip with selectively preserved etch stop remnants, including embodiments where the etch stop remnants are formed between conductive lines and embodiments where the etch stop remnants are formed between a conductive line and a lower layer, in accordance with an embodiment of the present invention.

Referring now to FIG. 14, a method of forming an integrated chip is shown. Block 1402 forms an etch stop layer 202 on an underlying layer 101 by any appropriate deposition process, such as CVD, ALD, PVD, or GCIB deposition. Block 1404 forms a patterning layer 302 on the etch stop layer 202 by any appropriate deposition process and block 1406 forms trenches 402 in the patterning layer 302 using, e.g., a photolithographic process.

At this stage, a mask 902 can be formed in one or more of the trenches 402 in block 1408, covering an underlying portion 904 of the etch stop layer 202 from an anisotropic etch of the etch stop layer 202 in block 1410. Block 1411 then removes the mask 902. The formation and removal of the mask 902 are optional steps that are used to preserve a portion of the etch stop layer 202.

Block 1412 forms conductive lines 502/1002 in the trenches. Block 1414 then etches away the patterning layer 302, exposing underlying portions of the etch stop layer 202. At this stage, a mask 702 can be formed between the conductive lines 502/1002 in block 1416, covering an underlying portion 704 of the etch stop layer 202 from an anisotropic etch of the etch stop layer 202 in block 1418. Block 1419 then removes the mask 702. The formation and removal of the mask 702 are optional steps that are used to preserve a portion of the etch stop layer. Block 1420 then forms interlayer dielectric 802/1202 to fill the spaces between the conductive lines 502/1002.

It should be understood that the etch stop remnants 704 and 1104 can both be formed in a single layer by forming masks 702 and 902 at the respective points in the process. In other embodiments, only one of the types of etch stop remnants can be formed, in accordance with the need for additional dielectric breakdown protection in certain regions of the chip.

Having described preferred embodiments of top vias with selectively retained etch stops (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming an integrated chip, comprising:
   patterning a layer of dielectric material on an underlying layer to form regions of dielectric material;
   forming conductive lines on the underlying layer, between the regions of dielectric material, to a height that is greater than a height of the regions of dielectric material;
   selectively patterning the regions of dielectric material, leaving at least one dielectric remnant region and exposing a portion of a top surface of the underlying layer; and
   forming an interlayer dielectric over the underlying layer and the at least one dielectric remnant region, between the conductive lines.

2. The method of claim 1, wherein the dielectric material and the interlayer dielectric are formed from distinct and selectively etchable materials.

3. The method of claim 2, wherein the dielectric material is a high-k dielectric material.

4. The method of claim 1, further comprising forming the regions of dielectric material by:
   depositing a layer of the dielectric material on the underlying layer;
   depositing a patterning layer over the dielectric material;
   forming trenches in the patterning layer; and
   etching away portions of the layer of the dielectric material that are exposed in the trenches.

5. The method of claim 4, wherein forming the conductive lines comprises depositing a conductive material in the trenches after etching away the exposed portions of the layer of dielectric material.

6. The method of claim 4, wherein selectively patterning the dielectric material comprises:
   etching away remaining portions of the patterning layer after forming the conductive lines; and
   forming the mask between a pair of conductive lines to cover a remaining portion of the layer of dielectric material.

7. The method of claim 6, wherein selectively patterning the dielectric material further comprises:
   etching away exposed portions of the layer of dielectric material, after forming the mask, to leave the dielectric remnant region; and
   etching away the mask to expose the dielectric remnant region.

8. The method of claim 4, wherein the layer of dielectric material prevents damage to the underlying layer when forming trenches in the patterning layer.

9. A method for forming an integrated chip, comprising:
   selectively patterning a dielectric material, to leave at least one dielectric remnant region on an underlying layer and to expose at least one portion of a top surface of the underlying layer;
   forming conductive lines on the underlying layer to a height greater than a height of the at least one dielectric remnant region, after selectively patterning the dielectric material, with at least one conductive line being formed on a respective dielectric remnant region; and
   forming an interlayer dielectric over the underlying layer, between the conductive lines.

10. The method of claim 9, wherein the dielectric material and the interlayer dielectric are formed from distinct and selectively etchable materials.

11. The method of claim 10, wherein the dielectric material is a high-k dielectric material.

12. The method of claim 9, further comprising:
    depositing a layer of the dielectric material on the underlying layer;
    depositing a patterning layer over the dielectric material; and
    forming trenches in the patterning layer.

13. The method of claim 12, wherein forming the conductive lines comprises depositing a conductive material in the trenches after selectively patterning the dielectric material.

14. The method of claim 12, wherein selectively patterning the dielectric material comprises forming a mask in one or more of the trenches in the patterning layer to cover a portion of the layer of the dielectric material.

15. The method of claim 14, wherein selectively patterning the dielectric material further comprises:
    etching away exposed portions of the layer of dielectric material, after forming the mask, to leave the dielectric remnant region; and
    etching away the mask to expose the dielectric remnant region.

16. The method of claim 12, wherein the layer of dielectric material prevents damage to the underlying layer when forming trenches in the patterning layer.

17. An integrated chip, comprising:
    a plurality of conductive lines on an underlying layer, including a first conductive line and at least one additional conductive line;
    a first dielectric remnant, formed from a first dielectric material on an underlying layer and under the first conductive line, between the first conductive line and the underlying layer, wherein the at least one additional conductive line is formed on the underlying layer without an intervening dielectric layer; and
    an interlayer dielectric on the underlying layer, formed from a second dielectric material between the plurality of conductive lines.

18. The integrated chip of claim 17, wherein the first dielectric remnant includes dielectric material between adjacent conductive lines of the plurality of conductive lines.

19. The integrated chip of claim 17, further comprising a second dielectric remnant, formed from the first dielectric material on the underlying layer, wherein the second dielectric remnant is between two conductive lines of the plurality of conductive lines.

20. The integrated chip of claim 19, wherein the second dielectric remnant does not occupy a space directly between either of the two conductive lines and the underlying layer.

* * * * *